United States Patent
Tsuchiya et al.

(10) Patent No.: US 8,592,924 B2
(45) Date of Patent: Nov. 26, 2013

(54) SEMICONDUCTOR DEVICE INCLUDING GATE ELECTRODE HAVING A LAMINATE STRUCTURE AND A PLUG ELECTRICALLY CONNECTED THERETO

(75) Inventors: Yoshinori Tsuchiya, Yokohama (JP); Masato Koyama, Miura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/470,372

(22) Filed: May 14, 2012

(65) Prior Publication Data
US 2012/0223393 A1 Sep. 6, 2012

Related U.S. Application Data

(60) Division of application No. 12/549,308, filed on Aug. 27, 2009, which is a continuation of application No. 12/219,096, filed on Jul. 16, 2008, now Pat. No. 7,601,623, which is a continuation of application No. 11/329,228, filed on Jan. 11, 2006, now Pat. No. 7,429,777, application No. 13/470,372, which is a division of application No. 12/549,298, filed on Aug. 27, 2009, now Pat. No. 8,203,189, which is a continuation of application No. 12/219,096, filed on Jul. 16, 2009, now Pat. No. 7,601,623, which is a continuation of application No. 11/329,228, filed on Jan. 11, 2006, now Pat. No. 7,429,777.

(51) Int. Cl.
*H01L 29/49* (2006.01)

(52) U.S. Cl.
USPC .... 257/412; 257/4; 257/E21.204; 257/E29.16

(58) Field of Classification Search
USPC .............. 257/4, 412, 413, E21.202–E21.204, 257/E29.154–E29.161
See application file for complete search history.

(56) References Cited

U.S. PATENT DOCUMENTS

| | | | |
|---|---|---|---|
| 5,854,114 A | 12/1998 | Li et al. | |
| 6,020,024 A | 2/2000 | Maiti et al. | |
| 6,696,345 B2 | 2/2004 | Chau et al. | |
| 6,936,508 B2* | 8/2005 | Visokay et al. | 438/199 |
| 7,429,777 B2 | 9/2008 | Tsuchiya et al. | |
| 2005/0282341 A1 | 12/2005 | Park et al. | |

FOREIGN PATENT DOCUMENTS

| | | |
|---|---|---|
| JP | 57-48268 | 3/1982 |
| JP | 5-206461 | 8/1993 |

(Continued)

OTHER PUBLICATIONS

Notification of Reason for Refusal issued by the Japanese Patent Office on Nov. 27, 2007, for Japanese Patent Application No. 2005-051355, and English-language translation thereof.

*Primary Examiner* — Marcos D. Pizarro
(74) *Attorney, Agent, or Firm* — Finnegan, Henderson, Farabow, Garrett & Dunner, L.L.P.

(57) ABSTRACT

A semiconductor device includes a semiconductor substrate having a semiconductor layer, a gate electrode, a source region, a drain region, an element separation insulating film layer and a wiring. The gate electrode include a laminated structure having a gate insulating film formed on the semiconductor layer, a metal or a metallic compound formed on the gate insulating film and a polycrystalline silicon layer formed on the metal or metallic compound. The source region and drain region are formed on a surface portion of the semiconductor substrate and sandwich the gate electrode therebetween. The element separation insulating film layer surrounds the semiconductor layer. The wiring is in contact with the metal or metallic compound of the gate electrode.

5 Claims, 9 Drawing Sheets

(56) References Cited

FOREIGN PATENT DOCUMENTS

| | | |
|---|---|---|
| JP | 11-17165 | 1/1999 |
| JP | 11-126902 | 5/1999 |
| JP | 2001127158 A * | 5/2001 |
| JP | 2003-142683 | 5/2003 |

* cited by examiner

SEMICONDUCTOR DEVICE INCLUDING GATE ELECTRODE HAVING A LAMINATE STRUCTURE AND A PLUG ELECTRICALLY CONNECTED THERETO

This is a divisional application of U.S. patent application Ser. Nos. 12/549,308 and 12/549,298 now U.S. Pat. No. 8,203,189, both filed Aug. 27, 2009, which are continuation applications of U.S. patent application Ser. No. 12/219,096, filed Jul. 16, 2008 (now U.S. Pat. No. 7,601,623 B2, issued Oct. 13, 2009), which is a continuation application of U.S. patent application Ser. No. 11/329,228, filed Jan. 11, 2006 (now U.S. Pat. No. 7,429,777 B2, issued Sep. 30, 2008), which are incorporated herein by reference.

This application is based upon and claims the benefit of priority from the Japanese Patent Application No. 2005-051355 filed on Feb. 25, 2005; the entire contents of which are incorporated herein by reference.

BACKGROUND OF THE INVENTION

1. Field of the Invention

The present invention relates to a semiconductor device and particularly relates to a CMIS device forming a silicon large scale-integrated circuit to achieve high-grade information processing.

2. Description of the Related Art

Silicon large scale-integrated circuit is one of basic techniques for supporting the future high-grade information-driven society. High performance of a CMIS device, which is a constituent element of an integrated circuit, is required for making the function of the integrated circuit high. Although performance of an element has been fundamentally made high by a proportionally scaling rule, there is a situation where recent various physical limits have made it difficult to increase performance based on the very fine structure of the element and operate the element per se. One of difficulties is a problem that the effective thickness of an insulating film is prevented from being reduced due to depletion of a polycrystalline Si gate electrode. Although high performance of an MIS device has been achieved by reduction in thickness of a gate insulating film in accordance with the proportionally scaling rule, higher performance of the MIS device is becoming difficult due to depletion of the polycrystalline Si gate electrode. The depletion-layer capacitance of the polycrystalline Si gate electrode will reach about 30% of the capacitance of an oxide film in a technical generation in which the thickness of the gate oxide film is smaller than 1 nm.

The depletion-layer capacitance can be reduced when the polycrystalline Si gate electrode is replaced by a metal gate electrode. A large issue in use of the metal electrode in the MIS device is a gate processing technique. Technical development of an RIE process is required so newly that metal can be processed with accuracy of the order of tens of nanometers. Particularly in a CMIS device, two kinds of electrode materials different in work function need to be used in accordance with the conduction type in order to achieve an optimum threshold voltage. Development of processing techniques according to the materials is essential. This requirement brings complication in technical development and fabricating process, so that there is a situation where increase in cost is unavoidable.

To avoid this problem, a polycrystalline Si/metal laminated gate electrode structure having a thin metal layer introduced into only the lower portion of the gate electrode, and polycrystalline Si used on the metal layer has been proposed (e.g. a gate electrode structure of metal [lower layer] and polycrystalline Si [upper layer] has been described in U.S. Pat. No. 6,020,024). When this structure is used, the aforementioned problem of processing can be avoided or reduced so that stress of the metal electrode at the time of heat treatment can be relaxed, and that the upper polycrystalline Si functions as an S/D ion implantation stopper to prevent ions from being injected into the channel. When this structure is applied to the gate electrode, a new depletion layer is however generated in the polycrystalline Si/metal Schottky interface. Therefore, suppression of depletion of the gate electrode, which is the original purpose of introduction of the metal gate, cannot be achieved.

SUMMARY OF THE INVENTION

In view of the circumstances set forth above, the invention has been made. Introduction of the metal gate electrode technique is essential to suppression of depletion of the gate electrode, and a polycrystalline Si/metal laminated structure is advantageous from the point of view of simplification of the processing technique on this occasion. However, depletion of the polycrystalline Si/metal interface is unavoidable. The invention suppresses depletion of a polycrystalline Si/metal interface while applying a polycrystalline Si/metal laminated structure to a gate electrode.

According to one embodiment of the invention, a semiconductor device includes a semiconductor substrate, a gate electrode, a gate insulating film, a source region and a drain region, an element separation insulating film layer and an upper wiring. The semiconductor substrate includes a semiconductor layer. The gate electrode includes a laminated structure having a gate insulating film, a metal or a metallic compound, and polycrystalline silicon layer. The gate insulating film is formed on the semiconductor layer. The metal or metallic compound is formed on the insulating film. The polycrystalline silicon layer is formed on the metal or the metallic compound. The source region and drain region, which are formed on a surface portion of the semiconductor substrate, sandwich the gate electrode therebetween. The element separation insulating film layer surrounds the semiconductor layer. The upper wiring is in contact with the metal or metallic compound of the gate electrode.

According to this structure, the gate electrode in the MIS transistor formed on the semiconductor substrate forms a polycrystalline Si/metal laminated structure, and the contact portion with the upper wiring is formed so that the upper wiring reaches the metal layer, which is the lower layer of the gate laminated structure. In this manner, the upper polycrystalline Si layer and the lower metal layer are kept in the same electrical potential. Therefore, depletion of the polycrystalline Si/metal interface can be suppressed.

As described above, according to one embodiment of the invention, in the MIS transistor formed on the semiconductor substrate, the gate electrode forms a polycrystalline Si (upper layer)/metal (lower layer) laminated structure and the contact portion with the upper wiring is formed so that the upper wiring reaches the metal layer, which is the lower layer of the gate laminated structure. In this manner, the upper polycrystalline Si layer and the lower metal layer are kept in the same potential. Accordingly, the electrical potential difference, which causes a problem of the polycrystalline Si/metal laminated gate structure, is not generated between the polycrystalline Si and the lower metal layer (TiN). Therefore, the depletion layer is not extended so that a voltage equal to the voltage applied to the gate is applied to the gate insulating film. Sufficient carrier can be formed in the channel region, so that improvement in drive current can be obtained. In addition, because gate processing can be obtained as development of the existing technique, fabrication of a semiconductor device having a metal gate electrode and technical development thereof can be simplified.

DETAILED DESCRIPTION OF EMBODIMENTS OF THE INVENTION

Embodiments of the invention will be described in detail below with reference to the accompanying drawings.

Embodiment 1

Figure 1:
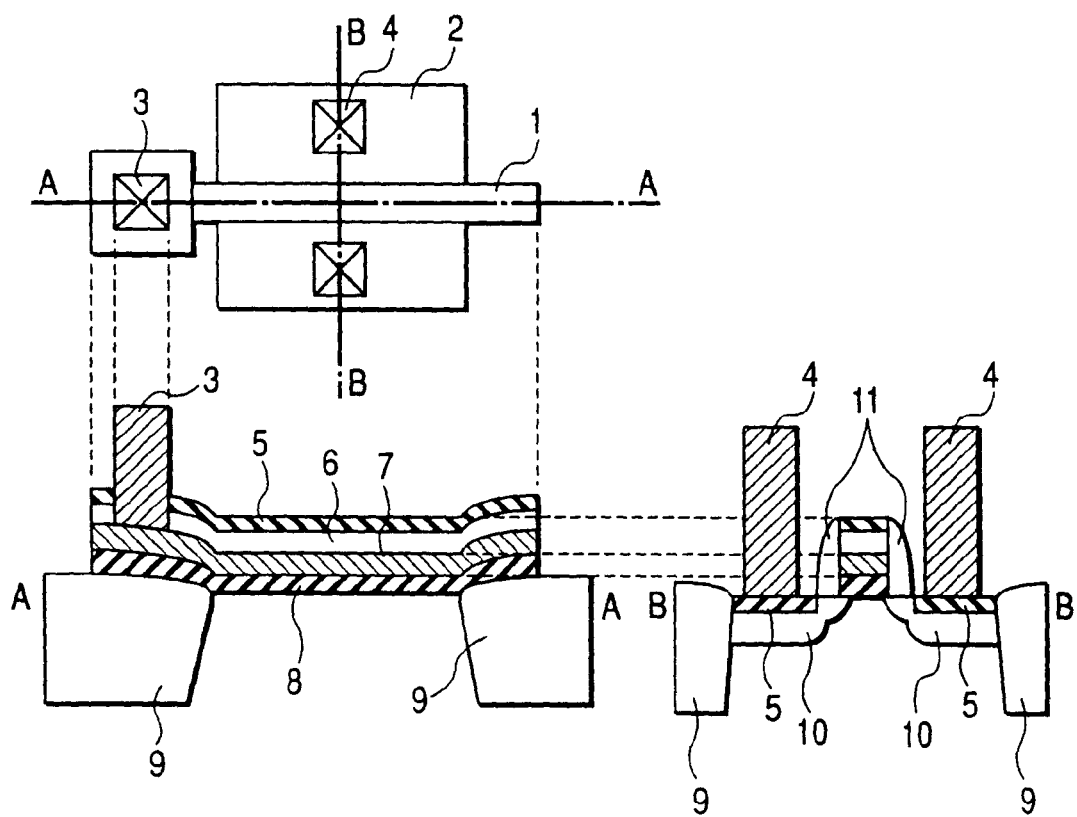
FIG. 1 shows a semiconductor device according to the invention.

FIG. 1 shows a semiconductor device according to a first embodiment of the invention.

A thermally oxidized silicon film layer 8 is formed as a gate insulating film layer on a p-type semiconductor layer of a silicon substrate. The thickness of the oxidized film 8 is preferably 2 nm or less. A gate electrode 1 is formed on the gate insulating film layer 8. The gate electrode 1 has a laminated structure, which includes a three-layer structure in which a TiN layer 7, a polycrystalline Si layer 6 and a NiSi layer 5 are laminated successively when viewed from the gate insulating film layer 8. The polycrystalline Si layer 6 is doped with high-concentration phosphorus. The film thicknesses of the three layers are preferably 10 nm, 50 nm and 10 nm respectively. The gate electrode 1 is connected to an upper wiring through a W gate contact plug 3.

In U.S. Pat. No. 6,020,024, an upper wiring plug is connected only to a silicide layer, which is an upper portion of a gate electrode. According to this embodiment of the invention, the structure of the gate contact portion is configured so that the W gate contact plug 3 of the upper wiring is connected to the gate electrode 1 in an element separation region and passes through the NiSi layer 5 and the polycrystalline Si layer 6, which are an upper portion of the laminated structure of the gate electrode 1, so as to come into contact with the TiN layer 7, which is a lower layer of the laminated structure. Although this embodiment shows the case where the upper wiring plug is made of W, a low-resistant metal material such as Al, Cu, etc. may be used suitably. In this case, a TiN film or another barrier film may be used on an upper side of the TiN layer 7 in order to improve adherence between the W gate contact plug 3 and an Si oxide film layer (not shown), which is present in the periphery of the W gate contact plug 3. Source-drain regions 10 are formed so that the laminated structure of the gate electrode and the gate insulating film layer 8 is sandwiched between the source-drain regions 10. A NiSi layer 5 for bringing an upper electrode and a diffusing layer into contact with each other is formed on each of the source-drain regions 10. The film thickness of the NiSi layer 5 located on the diffusing layer is preferably equal to that on the gate portion. Thus, an n-type MIS transistor is fabricated on the p-type semiconductor layer of the silicon substrate.

Although this embodiment shows the case where the lowermost layer of the gate electrode being in contact with the gate insulating film layer 8 is made of TiN, a metal material having a work function according to a threshold voltage necessary for the technical generation and purpose of each device may be used. A semiconductor layer such as a polycrystalline SiGe layer, a Ge layer, an SiC layer, etc. may be used as an intermediate layer of the gate electrode structure. Besides NiSi, a layer of low-resistant metal silicide, germano-silicide, germanide or carbide silicide may be used as the NiSi layer 5 located as the uppermost portion, in accordance with the semiconductor layer located as the intermediate layer. A structure in which the whole of the diffusing layer is replaced by metal, metal silicide or germanide, that is, a so-called Schottky type structure may be used as the structure of a source-drain region 2. In this case, a layer of rare earth metal represented by Er having a low Schottky barrier height with respect to electrons or a layer of silicide of the rare earth metal may be preferably used as the metal diffusing layer. A segregation Schottky structure in which P or As of high concentration is segregated on a metal/Si interface by use of a snowplow phenomenon at the time of siliciding reaction may be used in order to make the Schottky barrier low effectively. A source-drain and contact structure necessary for each generation may be used. Although this embodiment shows the case where a silicon oxide film is used as the gate insulating film layer 8, an insulating film material (high dielectric insulating film) higher in dielectric constant than the silicon oxide film may be used. For example, $Si_3N_4$, $Al_2O_3$, $Ta_2O_5$, $TiO_2$, $La_2O_5$, $CeO_2$, $ZrO_2$, $HfO_2$, $SrTiO_3$, $Pr_2O_3$, etc. may be used. A silicon oxide-metal ion mixture material such as Zr silicate or Hf silicate may be used effectively or a combination of silicon oxide-metal ion materials may be used. A high dielectric insulating film-nitrogen mixture material such as HfSiON may be used. In this manner, heat resistance of the gate insulating film layer 8 is improved to thereby make it easy to form the gate structure in a fabricating process. Materials necessary for the transistor of each generation can be selected suitably. Although the following embodiments will show the case where the gate insulating film layer 8 is made of a silicon oxide film while the gate electrode 1 is made of polycrystalline Si, it is a matter of course that these materials may be replaced by a high dielectric insulating film and a metal material respectively without particular notice. As for device structures other than the gate electrode structure, a structure according to the purpose of the device can be used for each generation without departing from the gist of the invention.

In the electrode structure in the embodiment shown in FIG. 1, the thin metal layer (TiN layer 7) is used in the gate electrode 1 on a side abutting against the gate insulating film layer 8. The thick polycrystalline Si layer 6 is formed on the metal layer. The NiSi layer 5 is formed on the polycrystalline Si layer 6 in order to reduce the sheet resistance of the electrode. Since the metal electrode is used at an interface with the gate insulating film layer 8, an interface depletion layer, which was formed in the case of using the type polycrystalline Si gate electrode of U.S. Pat. No. 6,020,024, can be prevented from being formed. To increase the drive current of MISFET, it is necessary to make the gate capacitance high. This has been achieved by reduction in thickness of the gate insulating film layer 8.

Nowadays, a technique of a technical generation for reducing the thickness of the Si oxide film to be smaller than 1 nm is required. In such a situation, parasitic capacitance included in the gate capacitance is making it difficult to increase the gate capacitance on the basis of reduction in thickness of the gate insulating film layer 8. As for the gate capacitance, a component of depletion-layer capacitance of the polycrystalline Si electrode is added in series to the capacitance of the gate insulating film. Because the solid solution limit of dopant in polycrystalline Si of the electrode is about $2 \times 10^{20}$ cm$^{-3}$ at the most, the depletion-layer capacitance is generated in accordance with the necessity of depleting a finite length to invert the Si substrate side and to block electric charges. The depletion-layer capacitance is present whenever the polycrystalline Si electrode is used. The depletion-layer capacitance reaches about 0.5 nm in terms of the thickness of the Si oxide film. Accordingly, the depletion-layer capacitance is a large factor of barrier in terms of the purpose of increasing gate capacitance by reducing thickness of the gate insulating film layer. As a measure to solve this problem, a metal material can be used as the gate electrode material to reduce the depletion-layer capacitance. The electron screening length of the metal material is extremely smaller than that of polycrystalline Si, so that the gate electrode 1 can be prevented from being depleted. Accordingly, the depletion-layer capacitance, which is a component in series to the capacitance of the gate insulating film, can be neglected, so that increase in gate capacitance can be brought. The same thing can be said also in the case where the gate insulating film layer 8 is replaced by a high-k material. This means that reduction in thickness of the gate insulating film layer 8 effectively advances by 0.5 nm in terms of the thickness of the Si oxide film. According to semiconductor road map 2003, when a metal electrode is used, the EOT required value can be relaxed compared with a polycrystalline Si electrode because the depletion-layer capacitance can be neglected, so that a gate insulating film layer 8 thick by about 0.7 nm in terms of the EOT required value can be applied. From this fact, the generation to introduce a high-k gate insulating film can be postponed, that is, the life of the existing SiON film can be elongated as long as the metal gate can be introduced early. Moreover, specifications required for each technical generation can be relaxed after introduction of the high-k gate insulating film, so that the time of introduction of a direct junction type high-k film on which a problem of degradation of mobility etc. is severe and has not been solved yet can be postponed.

Because the purpose of the metal gate electrode is to suppress depletion of the interface as described above, the purpose of the metal gate electrode can be achieved when a metal layer is introduced only into the vicinity of the interface with the gate insulating film layer 8 as in the embodiment shown in FIG. 1. Details will be described in a fabricating method later. In short, when the upper portion of the gate electrode 1 is made of a polycrystalline Si layer 6 in the same manner as in the U.S. Pat. No. 6,020,024, a device having a metal gate electrode can be fabricated easily. When such a structure is used, there is however a problem of depletion of the polycrystalline Si/metal interface as will be described below.

Figure 2A:
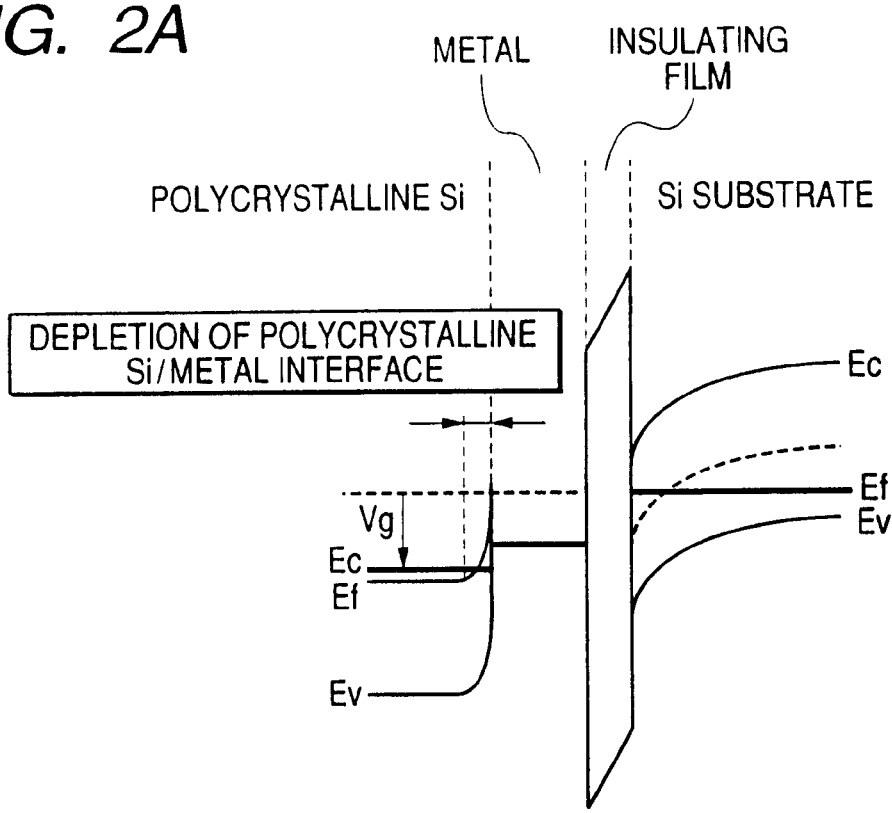
FIGS. 2A and 2B are energy band views of an Si substrate, a gate insulating film layer, a metal layer and a polycrystalline Si layer in the case where the metal layer is used as the lowermost layer while the polycrystalline Si layer is used on the metal layer.
Figure 2B:
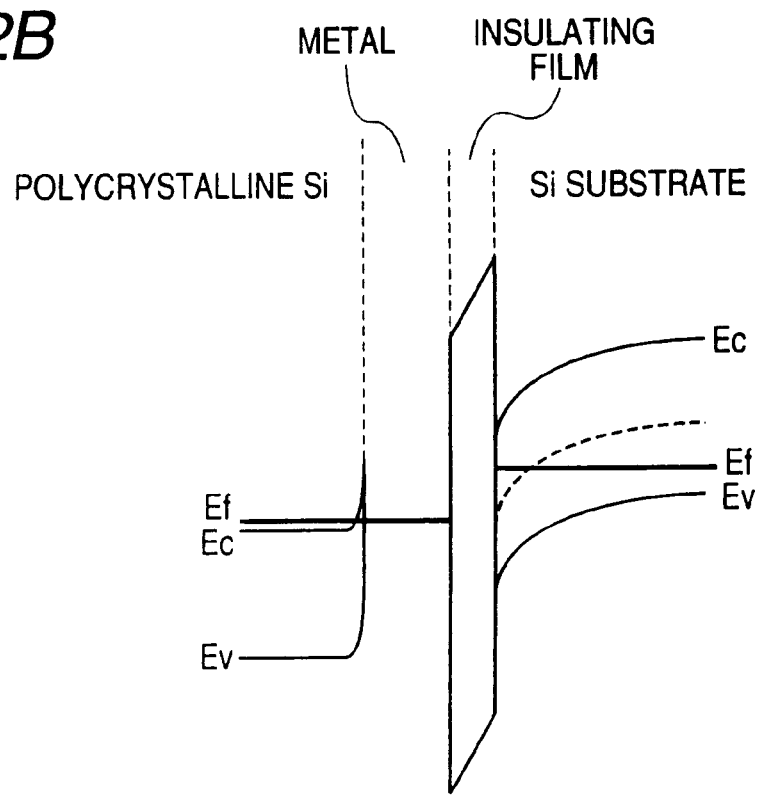

FIGS. 2A and 2B show views of energy bands of the Si substrate, the gate insulating film layer 8, the metal layer and the polycrystalline Si layer 6 in the case where a metal layer, which is the lowermost layer as shown in FIG. 1, is used in the gate electrode 1 while the polycrystalline Si layer 6 is used on the metal layer. FIG. 2A shows the case of a contact structure in which the upper wiring reaches only the NiSi layer 5, which is the uppermost portion of the gate electrode 1. In this case, when a gate voltage is applied at the time of transistor operation, the voltage is applied to the Schottky interface, which is the polycrystalline Si/metal interface, so that a long depletion layer is formed in accordance with the gate voltage. In this case, the voltage applied to the gate insulating film layer 8 is so insufficient that sufficient carrier cannot be formed in the channel surface. Accordingly, high performance of the transistor based on the introduction of the metal electrode cannot be achieved. This is because use of the metal electrode can eliminate the depletion layer from the gate electrode/gate insulating film interface but forms a new depletion layer in the polycrystalline Si/metal interface.

Therefore, as the gate contact structure of this embodiment shown in FIG. 1, there is used a structure in which the W plug of the upper wiring passes through the NiSi layer 5 and the polycrystalline Si layer 6, which are located in the upper portion of the laminated structure of the gate electrode 1, so as to come into contact with the TiN layer 7 located as the lower layer of the laminated structure. An energy band view in this case is shown in FIG. 2B. In this case, all contact portions of the gate electrode 1 are short-circuited so as to be kept in the same electrical potential. Accordingly, because there is no potential difference between polycrystalline Si and metal (TiN) of the lower layer, the depletion layer is prevented from being extended. Accordingly, a voltage equal to the voltage applied to the gate is applied to the gate insulating film layer 8, so that sufficient carrier can be formed in the channel region to obtain improvement in drive current. Accordingly, the gate contact structure of the gate electrode 1 and the upper wiring according to this embodiment permits the polycrystalline Si/metal electrode laminated gate electrode structure to be used for solving the problem. Although this embodiment relates to an n-type transistor formed on a p-type board, it is a matter of course that the invention can be applied to a p-type transistor formed on an n-type Si single crystal substrate or on a well.

FIGS. 4A to 4F are views for explaining a method of fabricating the semiconductor device according to this embodiment as shown in FIG. 1.

Element separation is formed by a shallow trench method to separate respective elements. The thermally oxidized silicon film 8 is formed in a surface of a p-type semiconductor layer of a silicon substrate in a device-forming region thus separated.

Figure 4A:
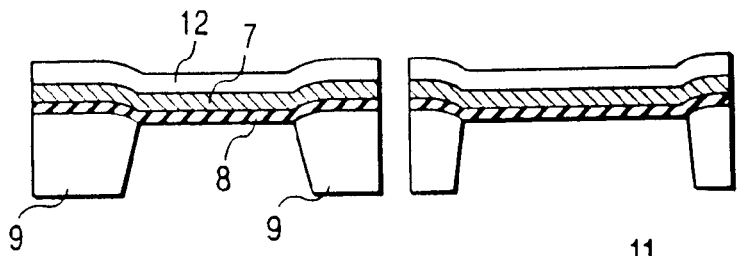
FIGS. 4A to 4F show a method of fabricating a semiconductor device according to the invention.

Then, the TiN film 7 and the polycrystalline silicon layer 12 are formed successively by CVD (FIG. 4A). Then, the polycrystalline Si layer 12, the TiN film 7 and the gate insulating film layer 8 are processed as a gate electrode by lithography. The source-drain regions 10 of an n-type MIS transistor are formed by implantation of arsenic ions. At the same time, As is also injected into the polycrystalline Si layer 12 of the gate electrode.

Figure 4B:
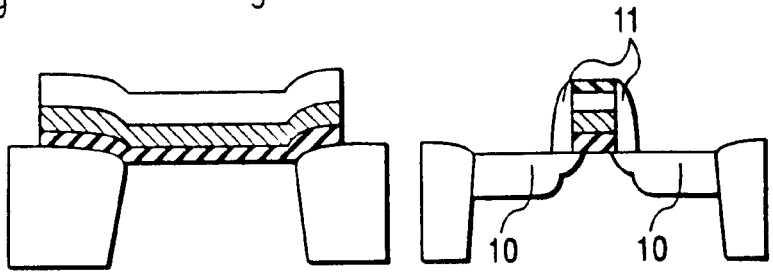
Figure 4C:
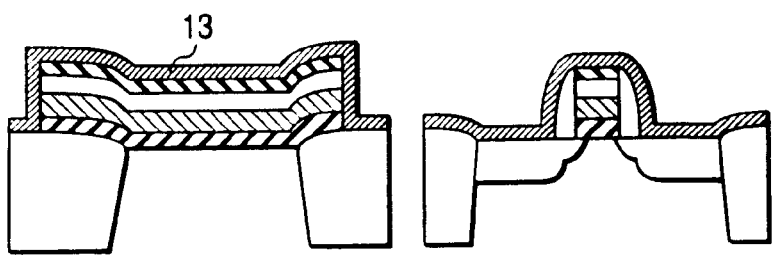
Figure 4D:
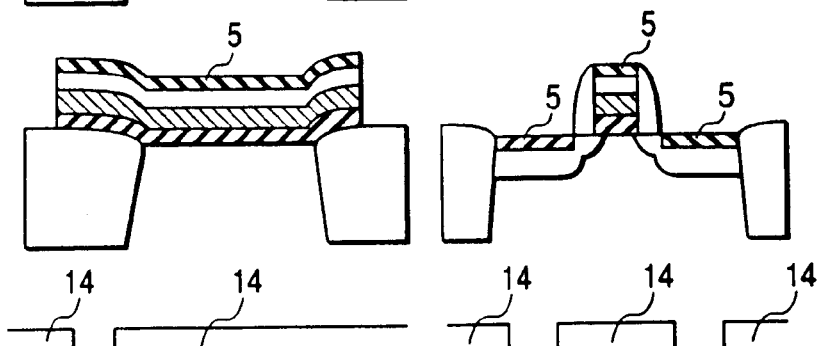
Figure 4E:
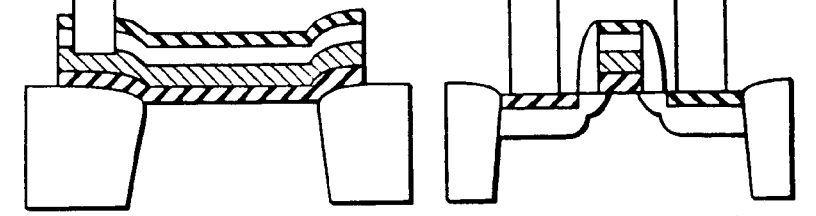
Figure 4F:
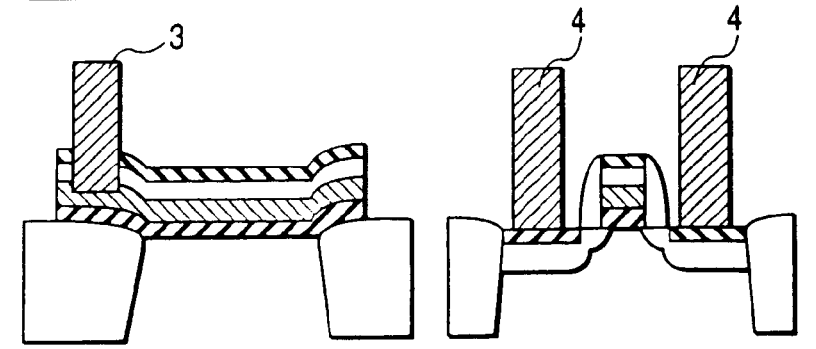

Then, side walls (gate side wall Si oxide film layers 11) are formed for electrically insulating the gate electrode 1 from the source-drain regions (FIG. 4B). Then, Ni is sputtered to form an 8 nm-thick Ni film (deposited nickel layer 13 in FIG. 4C)

and heat treatment is performed at 450° C. to form silicide only the upper portions of the gate electrode 1 and source-drain regions 10 to thereby form the NiSi layer 5 (FIG. 4D). Then, a BPSG film 14 is formed as a film between wiring layers of the upper wiring and CMP is performed to flatten a surface of the BPSG film 14. Then, an opening portion for a gate contact plug and opening portions for source-drain contact plugs are formed by photolithography and RIE. On this occasion, the plugs are stopped at upper ends of the NiSi layers 5. Then, only the gate contact plug is exposed by photolithography and RIE and the opening portion for the gate contact plug is excavated so as to reach the TiN film, which is the lower layer of the gate electrode (FIG. 4E). Then, W is embedded in each contact plug by CVD to thereby obtain a sectional structure shown in the first embodiment (FIG. 4F).

Embodiment 2

Figure 3:
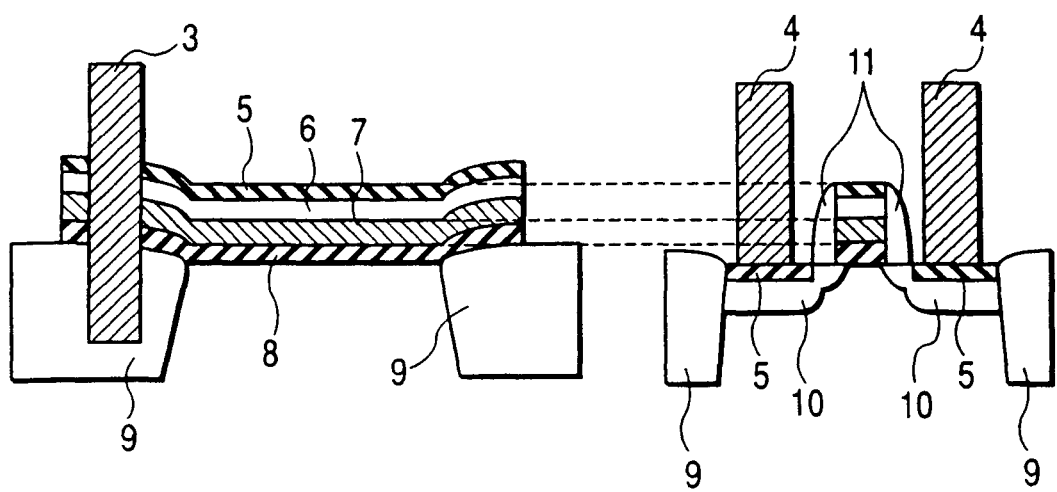
FIG. 3 shows a semiconductor device according to the invention.

FIG. 3 shows a semiconductor device according to a second embodiment of the invention.

As will be described later, when the W gate contact plug 3 of the gate electrode is excavated to an element separation insulating film layer 9 so as to pass through the TiN layer 7 and the insulating film layer located below the TiN layer 7 in the step of excavating the W gate contact plug 3 to the lower TiN layer, a structure shown in the second embodiment is formed. When one and the same kind of metal element is contained in both the metal layer located as the lower layer of the gate electrode 1 and the insulating film, a vapor pressure difference is too small to ensure the selection ratio in RIE process. Accordingly, in the case of a structure of HfN electrode/Hf oxide or Hf silicate, the excavating of the contact plug up to the element separation insulating film 9 facilitates the fabrication process.

Details will be described below. The thermally oxidized silicon film of the gate insulating film layer 8 is formed on the p-type semiconductor layer of the silicon substrate. The thickness of the oxide film is preferably 2 nm or less. The gate electrode 1 is formed on the gate insulating layer. The gate electrode 1 includes a laminated structure having a three-layer structure in which the TiN layer 7, the polycrystalline Si layer 6 and the NiSi layer 5 are laminated successively when viewed from the gate insulating film layer 8. The polycrystalline Si layer 6 is doped with high-concentration phosphorus. The film thicknesses of the three layers are preferably 10 nm, 50 nm and 10 nm, respectively. The gate electrode 1 is connected to an upper wiring through the W gate contact plug 3. The structure of the gate contact portion is configured so that the W plug 3 of the upper wiring is connected to the gate electrode 1 in the element separation region and passes through the laminated structure of the gate electrode 1 and the gate insulating film layer 8 to come into contact with the element separation Si oxide film 9, which is the lower layer. Although this embodiment shows the case where the upper wiring plug 3 is made of W, a low-resistant metal material such as Al or Cu may be used suitably. In this case, a TiN film may be used as a barrier film in order to improve adherence between a metal barrier layer and the Si oxide film. Source-drain regions 10, which are n-type high-density impurity regions, are formed on the p-type semiconductor layer of the silicon substrate to sandwich the laminated structure of the gate electrode 1 and the gate insulating film layer 8 therebetween. The NiSi layer 5 is formed on each of the source-drain regions 10 to bring the upper electrode and the diffusing layer into contact with each other. The film thickness of the NiSi layer 5 located on the diffusing layer is preferably equal to the film thickness of the NiSi layer 5 located on the gate portion. Thus, an n-type MIS transistor is formed on the p-type semiconductor layer of the silicon substrate.

Although this embodiment shows the case where the lowermost layer of the gate electrode being contact with the gate insulating film layer 8 is made of TiN, the lowermost layer may be made of a metal material having a work function in accordance with a threshold voltage necessary for the technical generation and purpose of each device. A semiconductor layer such as a SiGe layer, a Ge layer, a SiC layer, etc. may be used as an intermediate layer of the gate electrode structure. Besides NiSi, a layer of low-resistant metal silicide, germano-silicide, germanide or carbide silicide may be used as the uppermost NiSi layer 5 in accordance with the intermediate semiconductor layer. As for the other device structure than the gate electrode 1, a structure in accordance with the purpose of the device may be used in each generation without departing from the gist of the invention. Although this embodiment relates to an n-type transistor formed on a p-type board, it is a matter of course that the second embodiment of the invention can be effectively applied to a p-type transistor formed on an n-type Si single crystal substrate or on a well. In this embodiment, the W gate contact plug 3 reaches the element separation Si oxide film 9, which is an element separation STI. The STI is made of a Si oxide film and very poor in heat conductivity. In a technical generation in which the number of elements on one chip reaches several hundred millions so that element density becomes high greatly, there is a problem that heat is generated from the channel region due to the operation of the device. In the structure according to this embodiment, metal good in heat conductivity is embedded in the STI so that heat can be efficiently radiated to achieve both stability and speed of the element operation simultaneously. Particularly in the case of an SOI device shown in FIG. 12, the channel region is surrounded by the STI and an embedded insulating film layer 22, so that there is a situation in which heat generated in the channel portion is hardly radiated. When this embodiment is used for accelerating heat radiation, a stable device operation can be achieved.

Embodiment 3

Figure 5:
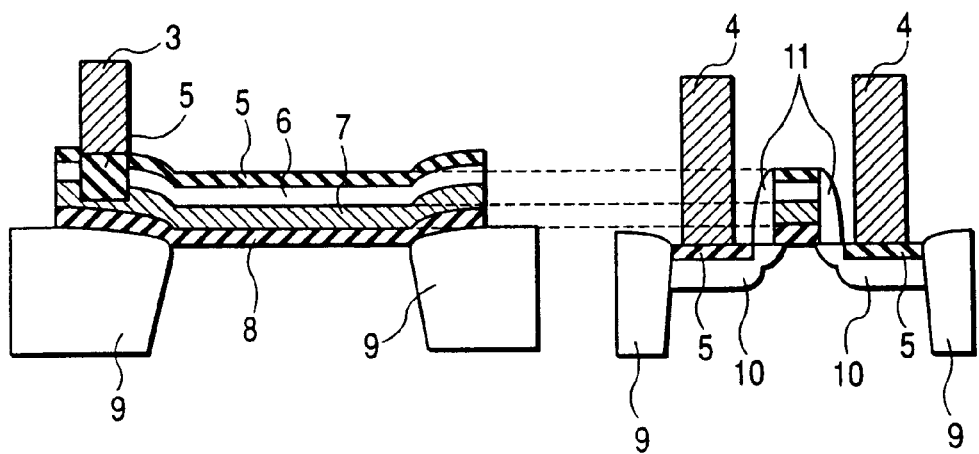
FIG. 5 shows a semiconductor device according to the invention.

FIG. 5 shows the semiconductor device according to a third embodiment of the invention.

A thermally oxidized silicon film is formed as a gate insulating film layer 8 on a p-type semiconductor layer of a silicon substrate. The thickness of the oxide film is preferably 2 nm or less. A gate electrode 1 is formed on the gate insulating film layer 8. The gate electrode 1 includes a laminated structure having a three-layer structure in which a TiN layer 7, a polycrystalline Si layer 6 and an NiSi layer 5 are laminated successively when viewed from the gate insulating film layer 8. The polycrystalline Si layer 6 is doped with high-concentration phosphorus. The film thicknesses of the three layers are preferably 10 nm, 50 nm and 10 nm, respectively. The gate electrode 1 is connected to an upper wiring through a gate contact plug 3. The structure of the gate contact portion is configured so that a NiSi film 5 is connected to the TiN film 7, and that the W gate contact plug 3 provided thereon is in contact with the NiSi layer 5.

Although this embodiment shows the case where the upper wiring plug 3 is made of W, a low-resistant metal material such as Al or Cu may be used suitably. In this case, a TiN film may be used as a barrier film in order to improve adherence between a metal barrier layer and the Si oxide film. Source-drain regions 10, which are n-type high-density impurity regions, are formed on the p-type semiconductor layer of the silicon substrate to sandwich the laminated structure of the gate electrode 1 and the gate insulating film layer 8 therebetween. A NiSi layer 5 is formed on each of the source-drain regions 10 to bring the upper electrode and the diffusing layer into contact with each other. The film thickness of the NiSi layer 5 located on the diffusing layer is preferably equal to the film thickness of the NiSi layer 5 located on the gate portion. W source-drain contacts 4 are connected to upper portions of the NiSi layers 5 located on the diffusing layers, respectively. Thus, an n-type MIS transistor is formed on the p-type semiconductor layer of the silicon substrate. Although this embodiment shows the case where the lowermost layer of the gate electrode being contact with the gate insulating film layer 8 is made of TiN, the lowermost layer may be made of a metal material having a work function in accordance with a threshold voltage necessary for the technical generation and purpose of each device. A semiconductor layer such as a SiGe layer, a Ge layer, an SiC layer, etc. may be used as an intermediate layer of the gate electrode structure. Besides NiSi, a layer of low-resistant metal silicide, germano-silicide, germanide or carbide silicide may be used as the uppermost NiSi layer 5 in accordance with the intermediate semiconductor layer. As for the other device structure than the gate electrode 1, a structure in accordance with the purpose of the device may be used in each generation without departing from the gist of the invention. Although this embodiment relates to an n-type transistor formed on a p-type board, it is a matter of course that the third embodiment of the invention can be effectively applied to a p-type transistor formed on an n-type Si single crystal substrate or on a well.

Figure 6A:
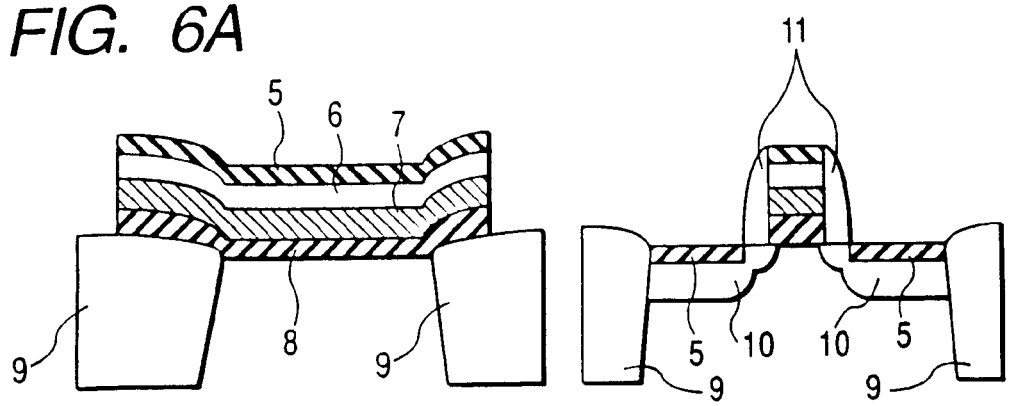
FIGS. 6A to 6C show a method of fabricating a semiconductor device according to the invention.
Figure 6B:
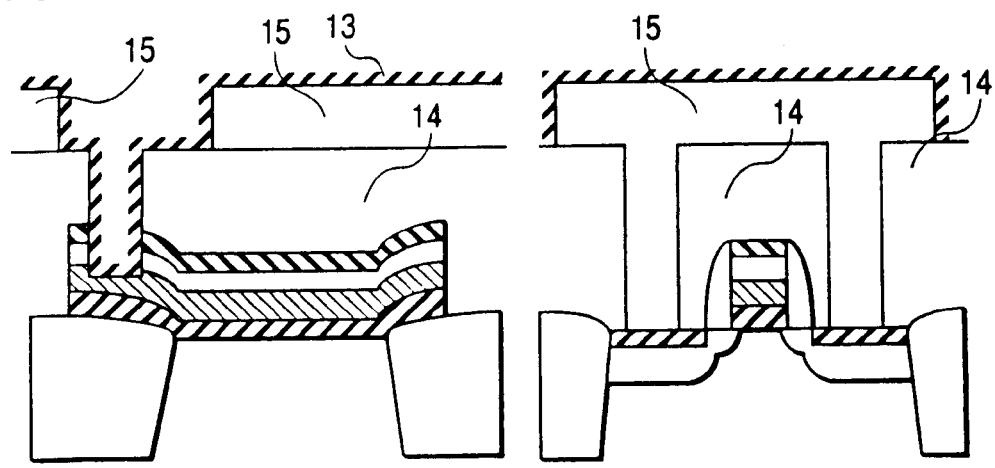
Figure 6C:
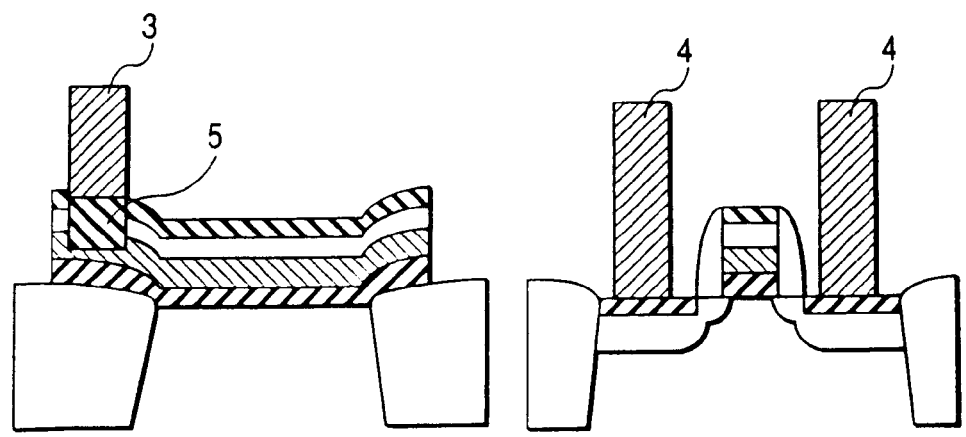

FIGS. 6A to 6C are views for explaining a method of fabricating a semiconductor device according to the third embodiment of the invention as shown in FIG. 5.

Element separation is formed by a shallow trench method to separate respective elements. A thermally oxidized silicon film is formed in a surface of a p-type semiconductor layer of a silicon substrate in the device-forming region thus separated. Then, a TiN film and a polycrystalline silicon layer are formed successively by CVD. Then, the gate electrode 1 and the gate insulating film layer 8 are processed by lithography. Source-drain regions 10 of an n-type MIS transistor are formed by implantation of arsenic ions. At the same time, As is also injected into the polycrystalline Si of the gate electrode 1. Then, side walls (gate side wall Si oxide film layers 11) are formed for electrically insulating the gate electrode 1 from the source-drain regions 10. Then, Ni is sputtered to form an 8 nm-thick Ni film and heat treatment is performed at 450° C. to form silicide only the upper portions of the gate electrode 1 and the source-drain regions 10 to thereby form an NiSi layer 5 (FIG. 6A). Then, a BPSG film 14 is formed as a film between wiring layers of the upper wiring and CMP is performed to flatten a surface of the BPSG film 14.

Then, an opening portion for a gate contact plug and opening portions for source-drain contact plugs are formed by photolithography and RIE (not shown). On this occasion, the plugs are stopped at upper ends of the NiSi layers 5. Then, only the gate contact plug is exposed by photolithography and RIE and Ni is sputtered to form a 20 nm-thick Ni film (FIG. 6B). Then, heat treatment is performed at 450° C. to thereby fully silicide (NiSi) the polycrystalline Si of the gate electrode 1 in the W gate contact plug opening portion. Finally, W is embedded in each contact plug by CVD to thereby obtain a sectional structure of the third embodiment (FIG. 6C).

Embodiment 4

Figure 7:
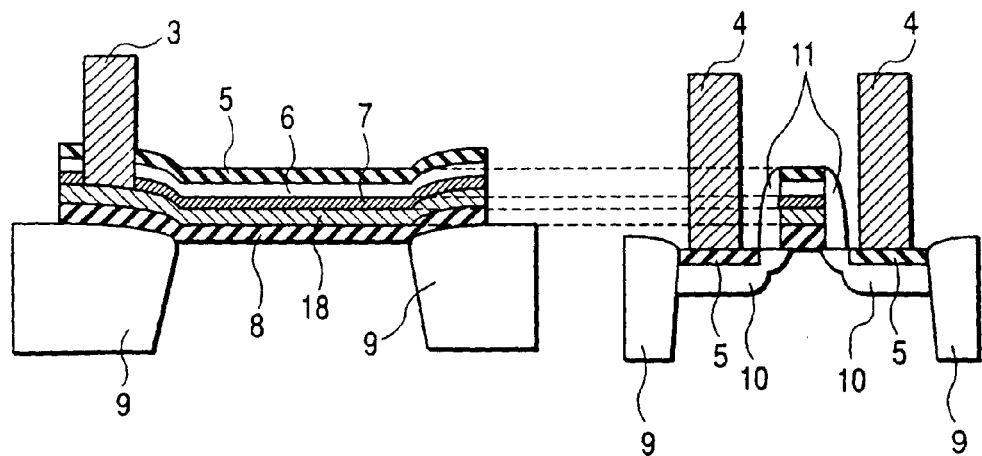
FIG. 7 shows a semiconductor device according to the invention.

FIG. 7 shows the semiconductor device according to a fourth embodiment of the invention.

A thermally oxidized silicon film is formed as a gate insulating film layer 8 on a p-type semiconductor layer of a silicon substrate. The thickness of the oxide film is preferably 2 nm or less. A gate electrode is formed on the gate insulating film layer 8. The gate electrode includes a laminated structure having a four-layer structure in which an $LaB_6$ layer 18, a TiN layer 7, a polycrystalline Si layer 6 and an NiSi layer 5 are laminated successively when viewed from the gate insulating film layer 8. The polycrystalline Si layer 6 is doped with high-concentration phosphorus. The film thicknesses of the four layers are preferably 10 nm, 5 nm, 45 nm and 10 nm, respectively. The gate electrode 1 is connected to an upper wiring through a gate contact plug 3. The structure of the gate contact portion is configured so that the W gate contact plug 3 of the upper wiring passes through the NiSi layer 5, the polycrystalline Si layer 6 and the TiN layer 7 so as to come into contact with the $LaB_6$ layer 18.

Although this embodiment shows the case where the upper wiring plug 3 is made of W, a low-resistant metal material such as Al or Cu may be used suitably. In this case, a TiN film etc. may be used as a barrier film in order to improve adherence between a metal barrier layer and the Si oxide film. Source-drain regions 10, which are n-type high-density impurity regions, are formed on the p-type semiconductor layer of the silicon substrate to sandwich the laminated structure of the gate electrode 1 and the gate insulating film layer 8 therebetween. A NiSi layer 5 is formed on each of the source-drain regions 10 to bring the upper electrode and the diffusing layer into contact with each other. The film thickness of the NiSi layer 5 located on the diffusing layer is preferably equal to the film thickness of the NiSi layer 5 located on the gate portion. W source-drain contacts 4 are connected to upper portions of the NiSi layers 5 located on the diffusing layers, respectively. Thus, an n-type MIS transistor is formed on the p-type semiconductor layer of the silicon substrate. Although this embodiment shows the case where the lowermost layer of the gate electrode being contact with the gate insulating film layer 8 is made of $LaB_6$ having an effective work function of about 3.8-4.0 eV, which is substantially equal to that of a heavily doped p-type polycrystalline Si gate, the lowermost layer may be made of a metal material having a work function in accordance with a threshold voltage necessary for the technical generation and purpose of each device. The TiN layer 7 is a reaction barrier layer for suppressing a reaction in the interface between the $LaB_6$ layer 18 and the polycrystalline Si. At the same time, reduction in resistance can be achieved because TiN is lower in resistance than polycrystalline Si. Besides the TiN film, a material such as TaN, TiSiN, TiAlN, HfN, etc., which can form a reaction barrier layer with respect to metal and which can bear under an impurity activation heat treatment at about 1000° C., may be used. An optimum barrier layer may be used in accordance with the kind of the metal or metallic compound layer as the lower layer. A semiconductor layer such as a SiGe layer, a Ge layer, an SiC layer, etc. may be used as an intermediate layer of the gate electrode structure. Besides NiSi, a layer of low-resistant metal silicide, germano-silicide, germanide or carbide silicide may be used as the uppermost NiSi layer 5 in accordance with the intermediate semiconductor layer. As for the other device structure than the gate electrode 1, a structure in accordance with the purpose of the device may be used in each generation without departing from the gist of the invention.

Embodiment 5

Figure 8:
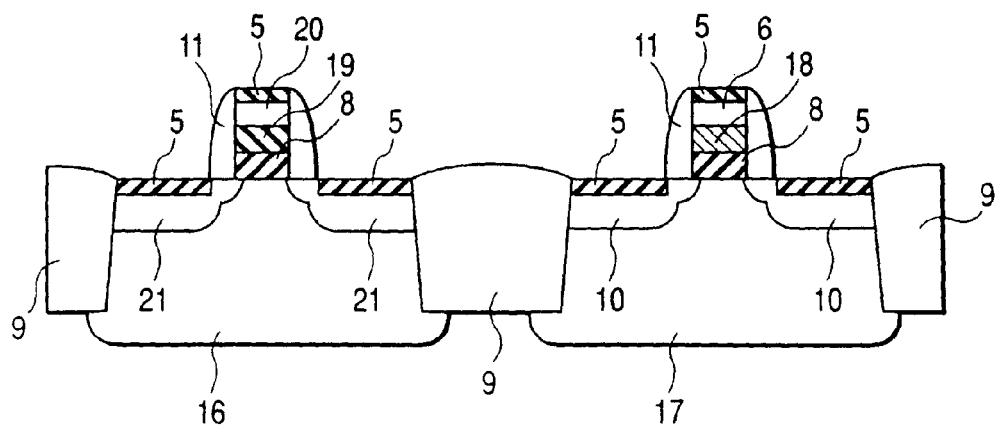
FIG. 8 shows a semiconductor device according to the invention.

FIG. 8 shows the semiconductor device according to a fifth embodiment of the invention.

A p-type impurity region (p-type well region 17) and an n-type impurity region (n-type well region 16) are separately formed on a p-type semiconductor layer of a silicon substrate. Both gate insulating film layers 8 are general thermally oxidized silicon film layers. The thickness of each gate insulating film layer 8 is preferably 2 nm or less. A gate electrode 1 is formed on each gate insulating film layer 8. The structure of the gate electrode 1 formed on the p-type well region 17 is configured so that an $LaB_6$ layer 18, a polycrystalline Si layer 6 doped with high-concentration phosphorus and an NiSi layer 5 are laminated successively on the thermally oxidized silicon film layer 8. On the other hand, the structure of the gate electrode 1 formed on the n-type well region 16 is configured so that a PtGe layer 19, a polycrystalline Si layer 20 doped with high-concentration boron and an NiSi layer 5 are laminated successively on the thermally oxidized silicon film layer 8. Source-drain regions 10, which are n-type high-density impurity regions, are formed in the p-well to sandwich the gate insulating film layer 8 therebetween. NiSi layers, which are contact electrodes, are formed on the source-drain regions 10, respectively. Thus, an n-type MIS transistor is fabricated in the p-type well region 17. On the other hand, source-drain regions 21, which are p-type high-density impurity regions, are formed on the n-type well region 16 to sandwich the gate insulating film layer 8 therebetween. NiSi layers are formed on the source-drain regions 21, respectively in the same manner as in the n-type MIS transistor. Thus, a p-type MIS transistor is fabricated in the n-type well region 16. The n-type MIS transistor and the p-type MIS transistor operate so as to be complementary to each other, so that the two transistors form a CMIS device. The contact shape of each transistor is provided in the same manner as in the first embodiment, that is, the W gate contact plugs 3 are connected to the $LaB_6$ layer 18 and the PtGe layer 19, which are a metallic compound layer as the lower layer.

Figure 9:
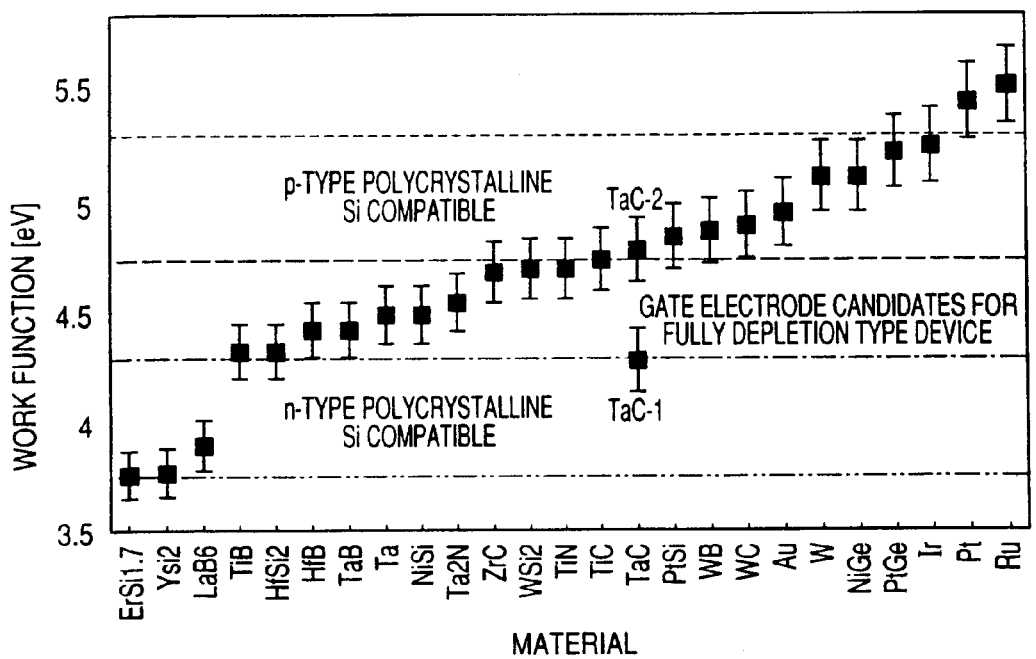
FIG. 9 shows the effective work function of each of metals and metallic compounds.
Figure 12:
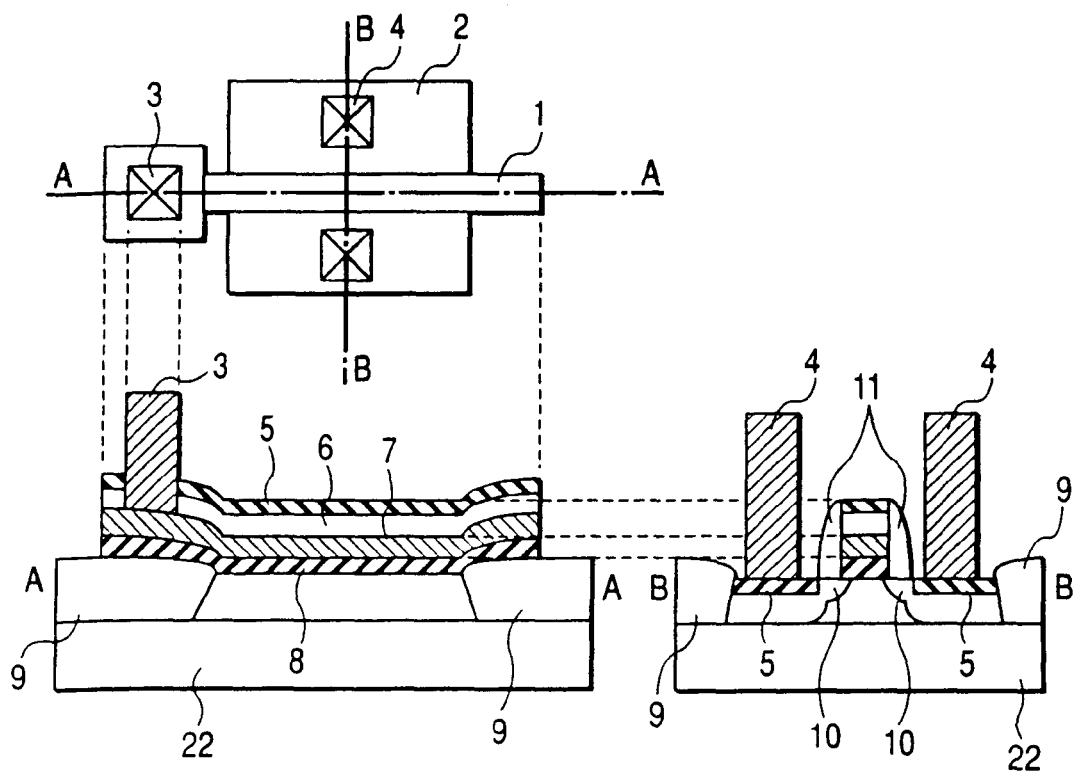
FIG. 12 shows a semiconductor device according to the invention.

According to this structure, the same effect as in the first embodiment can be obtained to achieve a high-speed CMIS operation. The same effect can be obtained also when the shape of the contact plug shown in the second or third embodiment is used. The shapes of the contact plugs shown in the second and third embodiments may be used in combination. FIG. 9 shows the effective work function of each of metals and metallic compounds. The value of the work function is extracted from capacitance-voltage characteristic of an MIS capacitor having a gate electrode made of each material. Variations in measured value are also shown together with the value of the work function. If the impurity concentration of the well is constant, the threshold value of the MIS transistor can be decided on the basis of the effective work function of the gate electrode measured by this method. In this embodiment, $LaB_6$ and PtGe are used as the lower layers of the gate electrodes 1 being in contact with the gate insulating film layers 8 of the n-type MIS and p-type MIS transistors, respectively. As shown in FIG. 9, the effective work function of $LaB_6$ is about 3.9 eV whereas the effective work function of PtGe is 5.2 eV. These values are coincident with the effective work functions of n-type and p-type polycrystalline Si gates fabricated by the existing technique. Accordingly, if these electrode materials are used, the metal gate electrode technique can be introduced without change of design values of other portions in the CMIS transistor. Rare earth metal silicide, transition metal silicide, germanide ($ErSi_{1.7}$, $YSi_2$, TaSi, $ErGe_{1.7}$), metal boride (HfB, TaB, TiB) or TaC is also suitable for the gate electrode material of an n-type MISFET. Metal carbide (TiC, TaC), precious metal silicide (PtSi, PdSi), metal nitride (TiN, TaN), metal germanide (NiGe, PtGe), W compound (WC, WB) or precious metal (Pt, Au, Ir, Ru, W) is also suitable for the gate electrode material of a p-type MISFET. In the case of a fully depletion type transistor represented by an SOI device having an embedded insulating film layer 22 as shown in FIG. 12, because the impurity concentration of the channel region becomes low, a gate electrode material having an effective work function value of about 4.6 eV needs to be used for each of the n-type and p-type transistors in order to optimize the threshold voltage of the transistor. Accordingly, in the case of a fully depletion type device, a material such as Ta, NiSi, $Ta_2N$, ZrC, $WSi_2$, TiN, TiC, etc. having an effective work function near 4.6 eV can be used for the lower layer of the gate electrode 1. Reduction in transistor operating threshold voltage has been required with the advance of technical generation and with the advance of reduction in source voltage. The required threshold of the transistor operating voltage varies according to the purpose of the device. Accordingly, a metal or a metallic compound having an effective work function necessary for obtaining an optimum threshold may be selected in accordance with each technical generation and the purpose of use of the device. The work function fundamentally takes a value specific to each material and can be decided uniquely. It is however known that the work function of a metal material varies according to the crystal face. It is generally known that, even in one material, the value of the effective work function increases as the face index of the crystal face increases. For example, it is known that the work function of (100) face of copper (Cu) is 4.6 eV whereas the work function of (111) face of copper (Cu) is 5.0 eV. Each value shown in FIG. 9 is an average of work functions in respective face indices of each electrode material, which is formed by a sputtering film-forming method so that large part of the electrode material is polycrystalline or amorphous. That is, the work function of even one material can be controlled to change from the value shown in FIG. 9 by about 0.4 eV at the most if the face index is controlled by an ALD method. Moreover, because the work function also depends on the crystal grain size, the controllable range of the work function of one material can be further widened. It is a matter of course that combination with these methods is effective.

Embodiment 6

Figure 10:
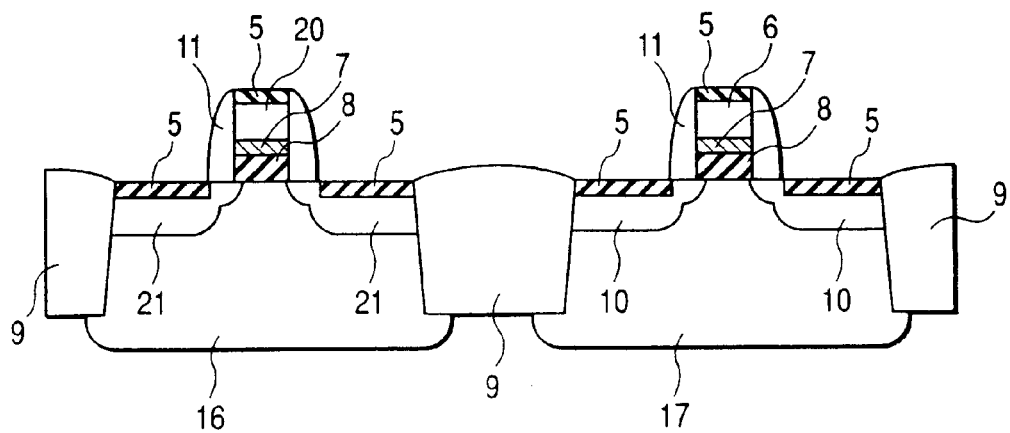
FIG. 10 shows a semiconductor device according to the invention.

FIG. 10 shows a sixth embodiment of the invention.

A p-type impurity region (p-type well region 17) and an n-type impurity region (n-type well region 16) are separately formed on a p-type semiconductor layer of a silicon substrate. Both gate insulating film layers 8 are general thermally oxidized silicon film layers. The thickness of each gate insulating film layer 8 is preferably 2 nm or less. A gate electrode 1 is formed on each gate insulating film layer 8. The structure of the gate electrode 1 formed on the p-type well region 17 is configured so that a TiN layer 7, a polycrystalline Si layer 6 doped with high-concentration phosphorus and an NiSi layer 5 are laminated successively on the thermally oxidized silicon film layer 8. On the other hand, the structure of the gate electrode 1 formed on the n-type well region 16 is configured so that a TiN layer 7, a polycrystalline Si layer 20 doped with high-concentration boron and an NiSi layer 5 are laminated successively on the thermally oxidized silicon film layer 8. The thickness of TiN in each conduction type well region is preferably 1 nm or less. Source-drain regions 10, which are n-type high-density impurity regions, are formed in the p-well to sandwich the gate insulating film layer 8 therebetween. NiSi layers, which are contact electrodes, are formed on the source-drain regions 10, respectively. Thus, an n-type MIS transistor is fabricated in the p-type well region 17. On the other hand, source-drain regions 21, which are p-type high-density impurity regions, are formed on the n-type well region 16 to sandwich the gate insulating film layer 8 therebetween. NiSi layers are formed on the source-drain regions 21, respectively, in the same manner as in the n-type MIS transistor. Thus, a p-type MIS transistor is fabricated in the n-type well region. The n-type MIS transistor and the p-type MIS transistor operate so as to be complementary to each other, so that the two transistors form a CMIS device. The contact shape of each transistor is configured so that the W gate contact plugs are connected to the $LaB_6$ layer 18 and the PtGe layer 19, which are a metallic compound layer as the lower layer, in the same manner as in the first embodiment.

Figure 11:
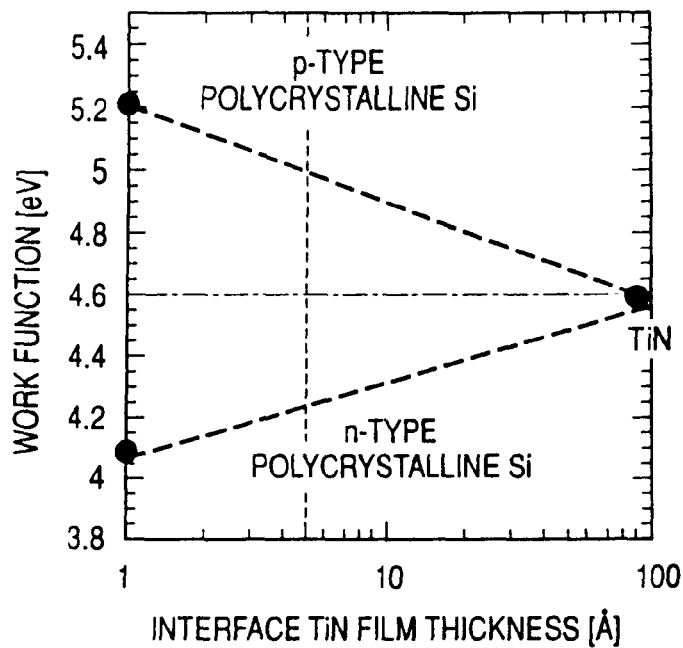
FIG. 11 shows TiN film thickness dependence of the effective work function of a polycrystalline Si/TiN thin film laminated gate electrode.

According to this structure, the same effect as in the first embodiment can be obtained to achieve a high-speed CMIS operation. The same effect can be obtained also when the shape of the contact plug shown in the second or third embodiment is used. The shapes of the contact plugs shown in the second and third embodiments may be used in combination. FIG. 11 shows TiN film thickness dependence of the effective work function of the TiN thin film/polycrystalline Si laminated gate electrode. If the thickness of the TiN layer, which is the lower layer, is not larger than 10 nm, the effective work function is affected by the work function of the polycrystalline Si electrode, which is the upper layer. Therefore, the effective work function continuously approaches the effective work function of each of the n-type polycrystalline Si electrode and the p-type polycrystalline Si electrode, as the thickness of the TiN film is reduced. In the embodiment shown in FIG. 9, the work function in the n-type MIS transistor approaches the effective work function of the n-type polycrystalline Si whereas the work function in the p-type MIS transistor approaches the effective work function of the p-type polycrystalline Si. Therefore, if the thickness of the TiN film is reduced to about 1 nm, the threshold value of the transistor can be controlled by the work function of the polycrystalline Si, which is the upper layer. Moreover, if the TiN layer 7 is 0.5 nm thick, depletion of the gate can be suppressed so perfectly that the metal gate electrode technique can be introduced easily. As described above in the fifth embodiment, the required effective work function varies according to each technical generation and the purpose of the device. When the thickness of the TiN film is controlled to be in a range of from 0.5 nm to 1.0 nm or when an interfacial metal layer near the valence band or conduction band of Si is used instead of TiN, the threshold value of the transistor can be controlled easily in accordance with variation in the required effective work function.

Although the first to sixth embodiments of the invention show the case where Si is used in the channel region, SiGe, Ge, distorted Si, etc. larger in mobility than Si may be used. Also, each embodiment may be applied to a three-dimensional structure device represented by FinFET and to a fully depletion type device. Various changes may be made on the invention without departing from the gist of the invention.

Various changes as described in the aforementioned embodiments can be made on this embodiment while the same effect can be obtained.

What is claimed is:

1. A semiconductor device comprising:
   a semiconductor substrate including:
      a semiconductor layer, and
      an element separation insulating film layer surrounding the semiconductor layer;
   a gate insulating film formed on the semiconductor layer;
   a gate electrode including:
      a metal or metallic compound layer formed on the gate insulating film,
      a polycrystalline silicon layer formed on the metal or metallic compound layer, and
      a metal silicide layer formed on the polycrystalline silicon layer;
   a source region and a drain region formed in the semiconductor layer so as to sandwich the gate electrode therebetween; and
   a plug formed to penetrate the gate electrode and the element separation insulating film layer.

2. The semiconductor device according to claim 1, wherein the plug includes:
   a plug bottom portion formed of a metal silicide material, and
   a plug upper portion formed on the plug bottom portion and formed of a metal material.

3. The semiconductor device according to claim 1, wherein the gate electrode further includes a metal nitride film between the metal or metallic compound layer and the polycrystalline silicon layer.

4. A fully depletion type transistor comprising:
   a semiconductor device according to claim 1; and
   an embedded insulating layer in the semiconductor substrate,
   wherein the metal or metallic compound layer mainly includes one selected from the group consisting of Ta, NiSi, $Ta_2N$, ZrC, $WSi_2$, TiN, and TiC.

5. A complementary transistor comprising:
   an n-type MIS transistor including a semiconductor device according to claim 1, in which the source region and the drain region are of n type; and
   a p-type MIS transistor including a semiconductor device according to claim 1, in which the source region and the drain region are of p type,
   wherein the metal or metallic compound layer in the n-type MIS transistor includes one selected from the group consisting of a rare earth metal silicide, a transition metal silicide, a germanide, a metal boride, and TaC, and
   wherein the metal or metallic compound layer in the p-type MIS transistor includes one selected from the group consisting of a metal carbide, a precious metal silicide, a metal nitride, a metal germanide, a W compound, and a precious metal.

* * * * *